(12) United States Patent
Yu et al.

(10) Patent No.: US 8,642,393 B1
(45) Date of Patent: Feb. 4, 2014

(54) PACKAGE ON PACKAGE DEVICES AND METHODS OF FORMING SAME

(75) Inventors: Chen-Hua Yu, Hsin-Chu (TW);
Mirng-Ji Lii, Sinpu Township (TW);
Chien-Hsun Lee, Chu-Tung Town (TW); Yung Ching Chen, Dali (TW);
Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/570,065

(22) Filed: Aug. 8, 2012

(51) Int. Cl.
*H01L 21/00* (2006.01)
*H01L 23/48* (2006.01)

(52) U.S. Cl.
USPC .......... 438/119; 438/106; 438/109; 438/118; 438/455; 257/678; 257/738; 257/784; 257/E21.499; 257/E23.024

(58) Field of Classification Search
None
See application file for complete search history.

(56) References Cited

U.S. PATENT DOCUMENTS

| | | | |
|---|---|---|---|
| 8,372,741 B1* | 2/2013 | Co et al. ................ | 438/617 |
| 2008/0303142 A1* | 12/2008 | Kim et al. .............. | 257/737 |
| 2010/0096778 A1* | 4/2010 | Appleby et al. ........ | 264/318 |
| 2012/0015481 A1* | 1/2012 | Kim ....................... | 438/108 |
| 2012/0313239 A1* | 12/2012 | Zohni ..................... | 257/737 |

FOREIGN PATENT DOCUMENTS

KR 101128063 * 4/2012 ............ 257/737

* cited by examiner

*Primary Examiner* — Julio J Maldonado
*Assistant Examiner* — Joseph Galvin, III
(74) *Attorney, Agent, or Firm* — Slater & Matsil, L.L.P.

(57) ABSTRACT

An embodiment is a package-on-package (PoP) device comprising a first package on a first substrate and a second package over the first package. A plurality of wire sticks disposed between the first package and the second package and the plurality of wire sticks couple the first package to the second package. Each of the plurality of wire sticks comprise a conductive wire of a first height affixed to a bond pad on the first substrate and each of the plurality of wire sticks is embedded in a solder joint.

19 Claims, 6 Drawing Sheets

PACKAGE ON PACKAGE DEVICES AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components may also require smaller packages that utilize less area than packages of the past.

Package on package (PoP) technology is becoming increasingly popular for its ability to allow for denser integration of integrated circuits into a small overall package. PoP technology is employed in many advanced handheld devices, such as smart phones. While PoP technology has allowed for a lower package profile, the total thickness reduction is currently limited by the solder ball joint height between the top package and bottom package.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
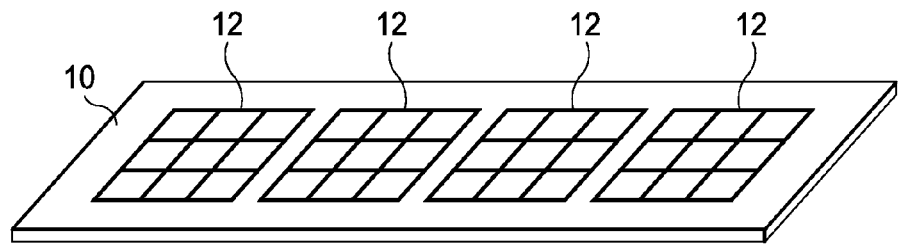
FIG. 1 illustrates a perspective view of a substrate according to an embodiment.

Various steps in the formation of a semiconductor device 1 will be described with reference to FIGS. 1 through 9. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely packaging for a semiconductor device utilizing wire sticks. Other embodiments may also be applied, however, to other semiconductor devices where assembly yield and bump height control is important.

FIGS. 1 through 9 illustrate a process to form a semiconductor device 1 according to an embodiment. Although this embodiment is discussed with steps performed in a particular order, steps may be performed in any logical order.

With reference now to FIG. 1, there is shown a first substrate 10 with bond areas 12 on a top surface of the first substrate 10. In an embodiment, the first substrate 10 may be a silicon substrate, a silicon or glass interposer, a printed circuit board (PCB), an organic laminate substrate, or the like. The first substrate 10 may include electronic components and elements formed thereon in some embodiments, or alternatively, the first substrate 10 may be free of electronic components and elements.

Figure 9:
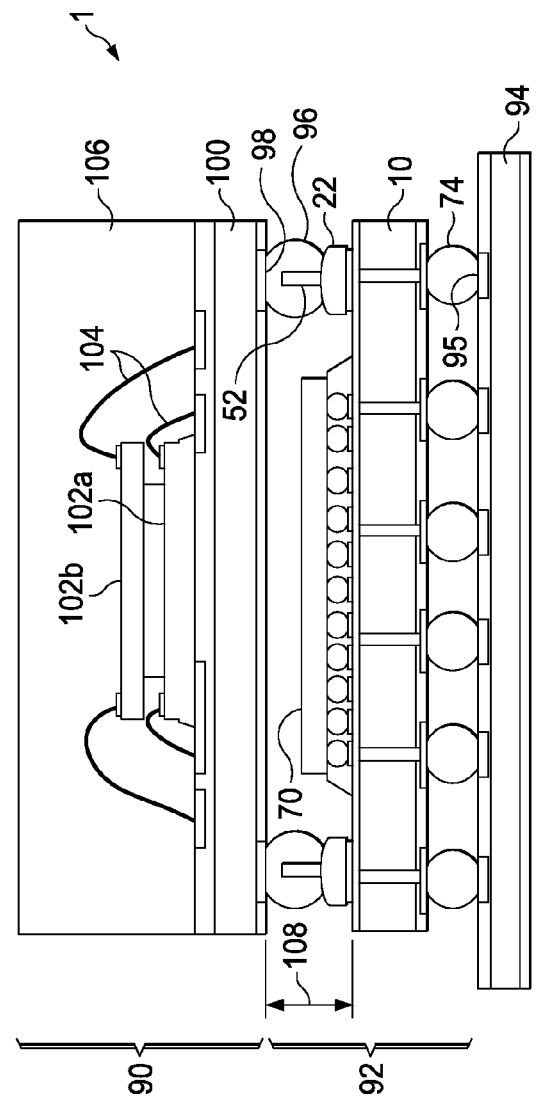
Figure 7:
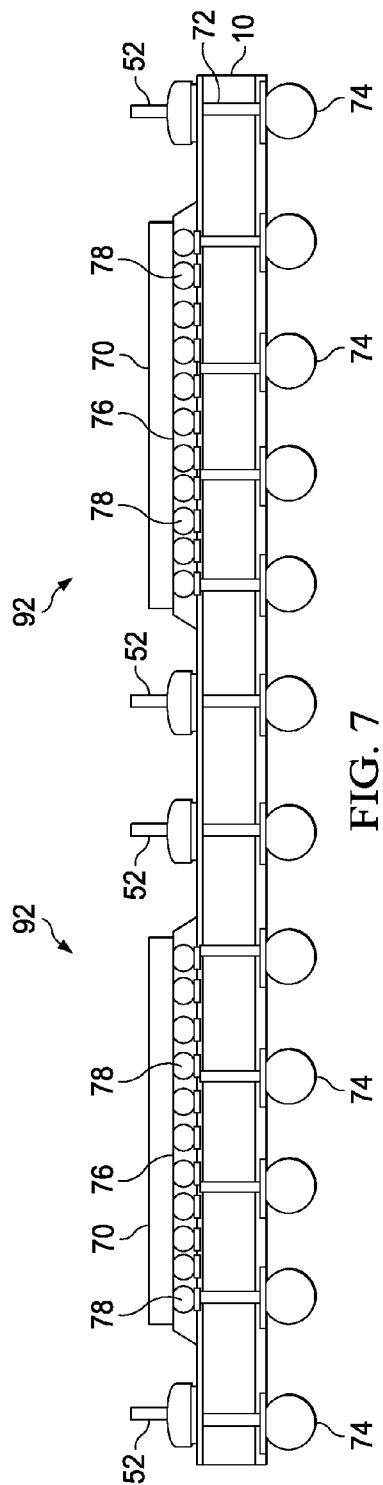
Figure 8:
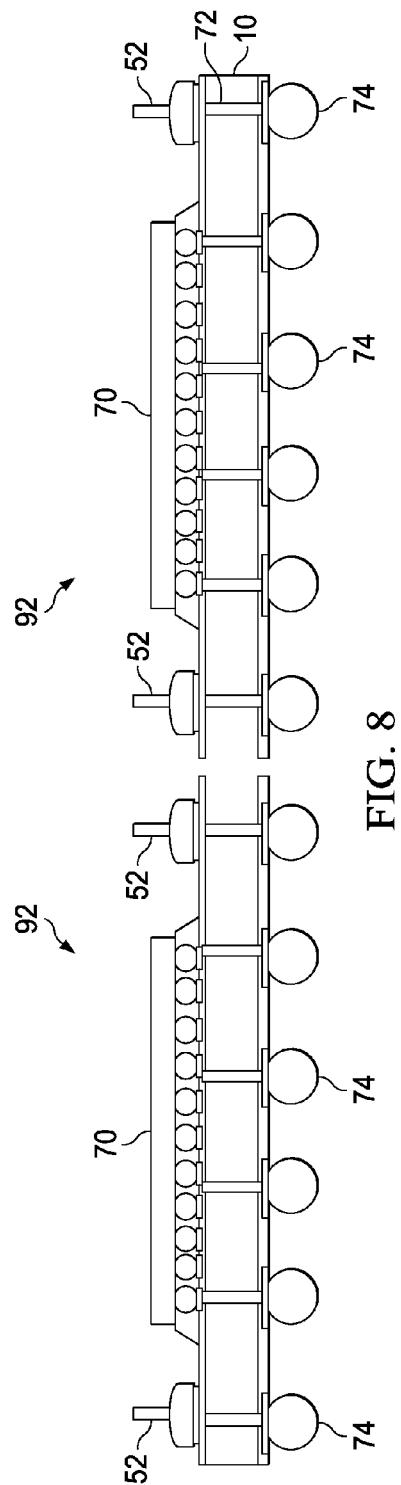

The first substrate 10 may include metallization layers (see FIGS. 7 through 9). As illustrated in FIG. 9, the metallization layers may comprise through substrate vias (TSVs) to connect the top package 90 and the bottom package 92 to form functional circuitry. The metallization layers may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias to electrically couple the top package 90 and the bottom package 92 (see FIG. 9). Only a portion of the first substrate 10 is illustrated in the figures, as this is sufficient to fully describe the illustrative embodiments.

Figure 2:
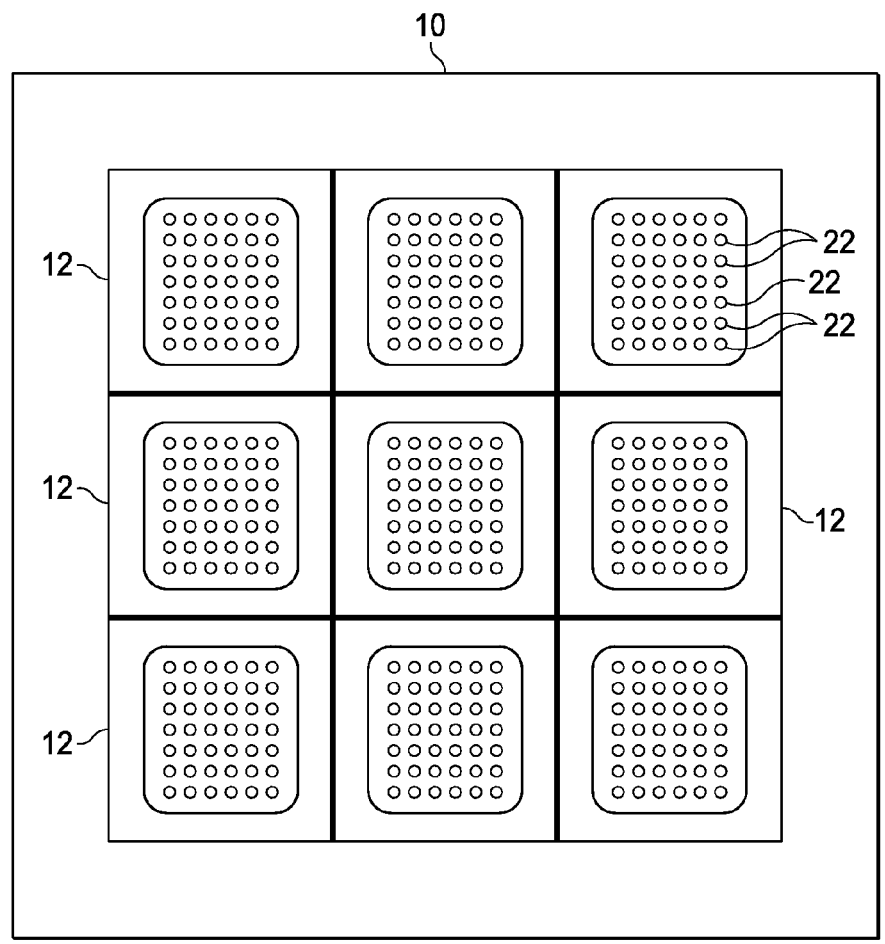
FIG. 2 illustrates a top-down view of a substrate according to an embodiment.

FIG. 2 illustrates a top-down view of a bond area 12 on the top surface of the first substrate 10. Each bond area 12 may comprise a plurality of bond pads 22. In FIG. 2, the bond pads 22 for a bond area 12 are arranged in a grid of nine sections, wherein each section comprises a plurality of rows and columns of bond pads 22. In other embodiments, the bond pads 22 may be arranged in a peripheral region of the first substrate 10 or in a central region of the first substrate 10. The bond pads 22 may fully populate the top surface or may be arranged in various patterns, such as, for example, patterns used in ball grid array (BGA) or land grid array (LGA) package devices.

The bond pads 22 may comprise a conductive material such as aluminum, copper, gold, nickel, the like, or a combination thereof. In some embodiments, an organic solderability preservative (OSP) may be applied to the bond pads 22. In an embodiment, the bond pads 22 may be copper. However, as copper oxidizes relatively rapidly when exposed to the temperatures of semiconductor processing, an OSP may be applied to the bond pads 22 to prevent such oxidation and permit long term storage of packages and maintain the solder adhesion capabilities of the bond pads 22. In other embodiments, the bond pads 22 may be formed using an electroless nickel-electroless palladium-immersion gold technique (ENEPIG).

An adhesive 50 (see FIGS. 5A and 5B) may be deposited on the bond pads 22, directly, or on the OSP, when used. This adhesive may be any conductive material that is configured to affix a wire stick 52 (see FIGS. 5A and 5B) to a bond pad 22. In an embodiment, an OSP may be deposited on a copper bond pad 22, with the adhesive 50 comprising solder paste or solder being applied to the OSP. In other embodiments, a conductive adhesive, comprising electrically conductive particles in an adhesive resin such as a polymer or epoxy may be employed. While several embodiments for deposition of an adhesive have been described herein, one skilled in the art will recognize that any conductive material capable of securing a wire stick 52 to a bond pad 22 is within the scope of this disclosure.

Figure 3:
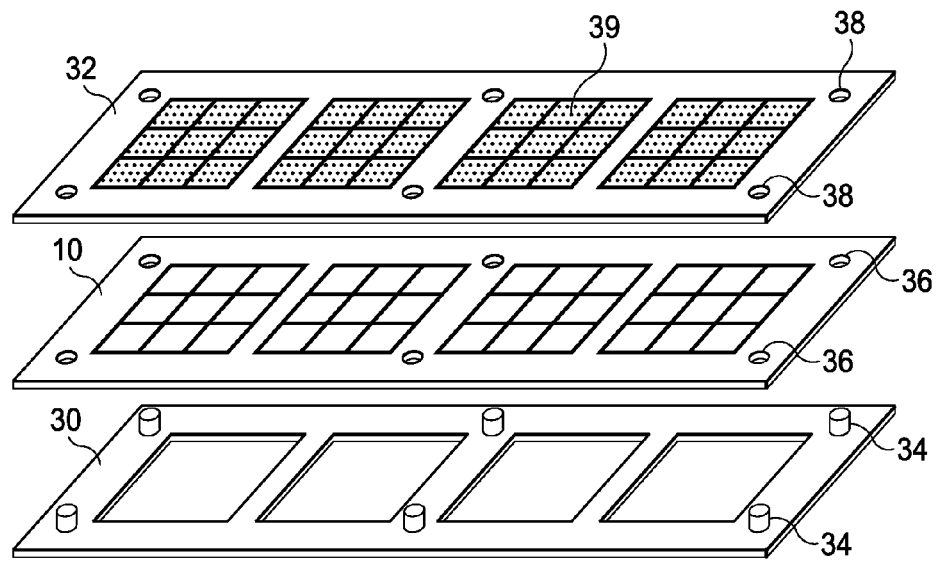
FIG. 3 illustrates a perspective view of a top plate, a substrate, and a bottom plate according to an embodiment.
Figure 5A:
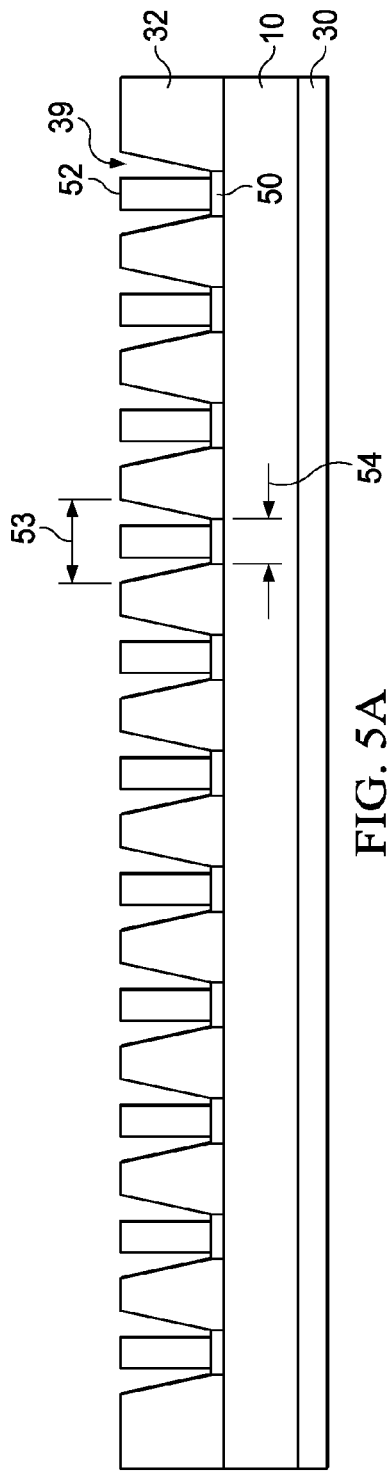
FIGS. 5A through 9 illustrate cross-sectional views of a method of forming a semiconductor device 1 according to an embodiment.
Figure 5B:
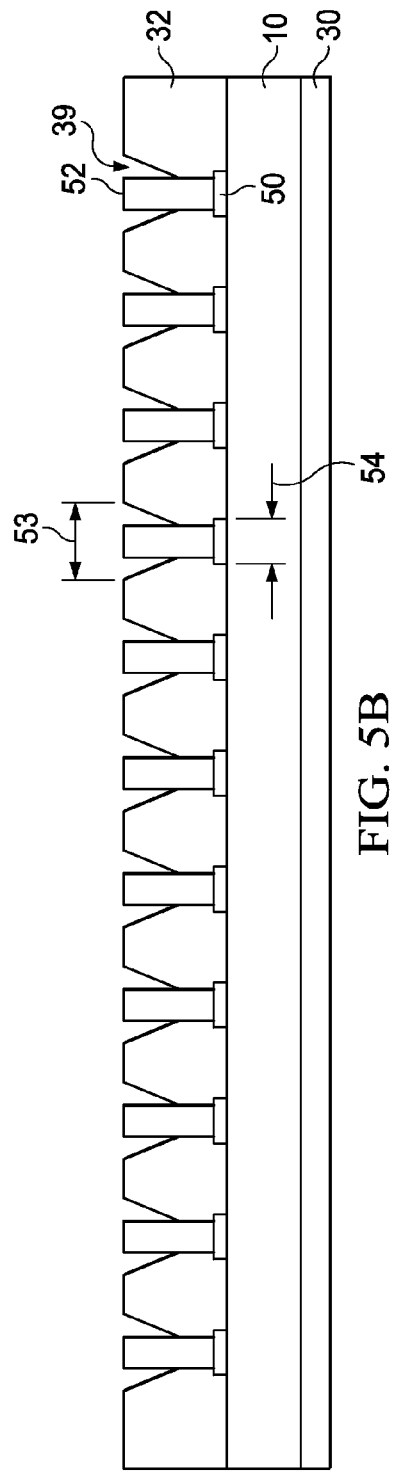

FIG. 3 illustrates the assembly of a bottom plate 30, the first substrate 10, and a top plate 32 to assist in the formation of the wire sticks 52 (see FIGS. 5A and 5B). The bottom plate 30 may comprise pins 34 which align with holes 36 in the first substrate 10 and holes 38 in the top plate 32. The pins and holes allow the bottom plate 30, the first substrate 10, and the top plate 32 to be aligned and stay aligned during the forming of the wire sticks 52 and transportation.

The top plate 32 may comprise pad holes 39 which may be aligned with the bond pads 22 of the first substrate 10. The pad holes 39 may provide support for the wire sticks 52 before they are affixed to the bond pads 22 as described below. The bottom plate 30 may be used to support the first substrate 10 and the top plate 32 during wire stick 52 formation and during transportation. In an embodiment, the bottom plate 30 may comprise openings to allow heating of the first substrate 10 (see FIG. 3). The top plate 32 and the bottom plate 30 may comprise stainless steel, plastic steel, the like, a same material as the first substrate 10, or a combination thereof. In an embodiment, the top plate 32 may have a thickness between about 0.05 mm and about 0.1 mm and the bottom plate 30 may have a thickness of about 2 mm.

Figure 4A:
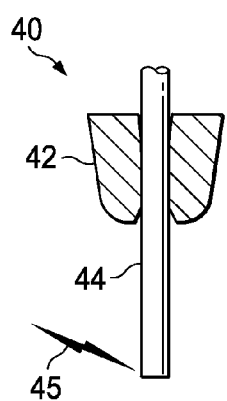
FIGS. 4A through 4D illustrate cross-sectional views of a method of forming wire sticks according to an embodiment.
Figure 6:
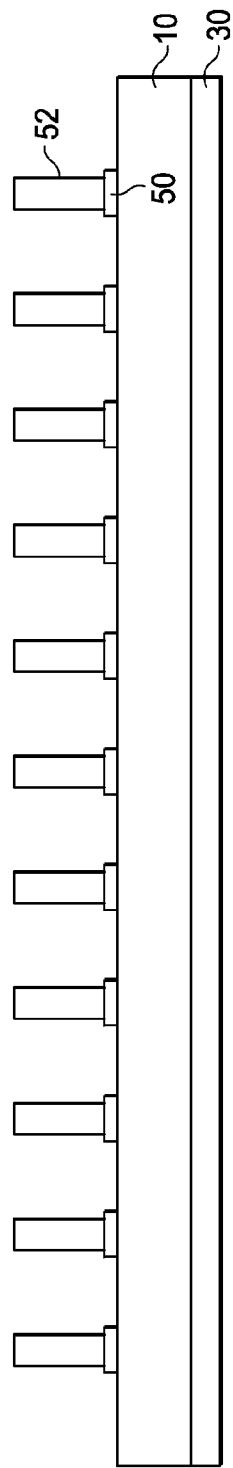

FIGS. 4A through 4D illustrate an example of a method of forming the wire sticks 52 shown, for example, in FIG. 5A, FIG. 5B, and FIG. 6. In FIG. 4A, a portion of a wire dispenser 40 that may be used to form the wire sticks 52 is illustrated. The wire dispenser 40 may include a capillary 42 for dispensing wire 44, an electric flame off (EFO) wand (not shown), and a transducer (not shown). The wire 44 may comprise copper, aluminum, gold, platinum, palladium, the like, or a combination thereof. In an embodiment, the wire 44 may have a diameter between about 1 mil and about 10 mil.

Figure 4B:
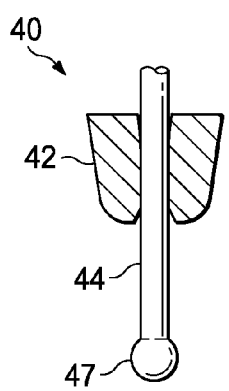

A first end of the wire 44 protrudes from the tip of the capillary 42. The EFO wand is used to create an electrical spark 45 proximate the first end of the wire 44, which may form a ball 47 at the first end of the wire 44, as shown in FIG. 4B. The ball 47 is formed using a free air ball (FAB) technique.

Figure 4C:
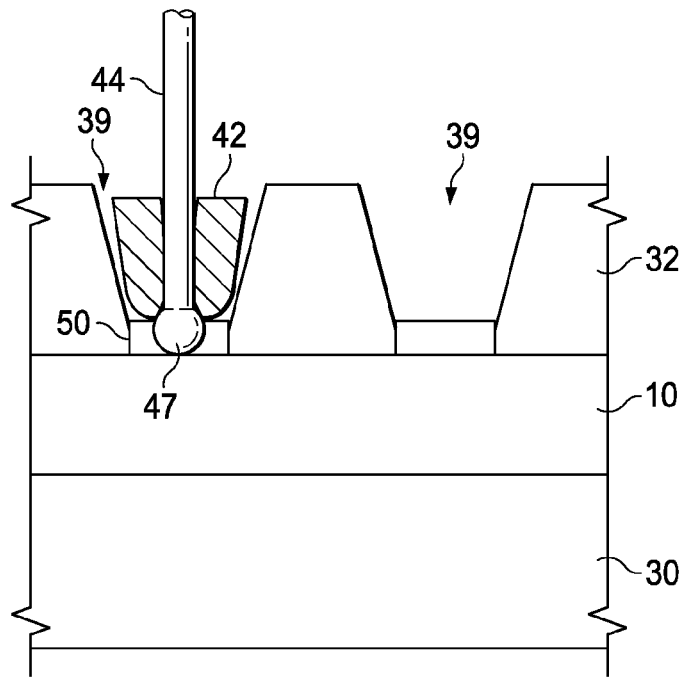

The capillary 42 then moves the ball 47 through the pad hole 39 of the top plate 32 and into the adhesive 50 on the bond pad 22, as shown in FIG. 4C. The capillary 42 may fit in the pad hole 39 of the top plate 32 (see FIG. 4C), and thus the width of the pad hole 39 may be dependent on the size of the capillary 42 (discussed below).

Figure 4D:
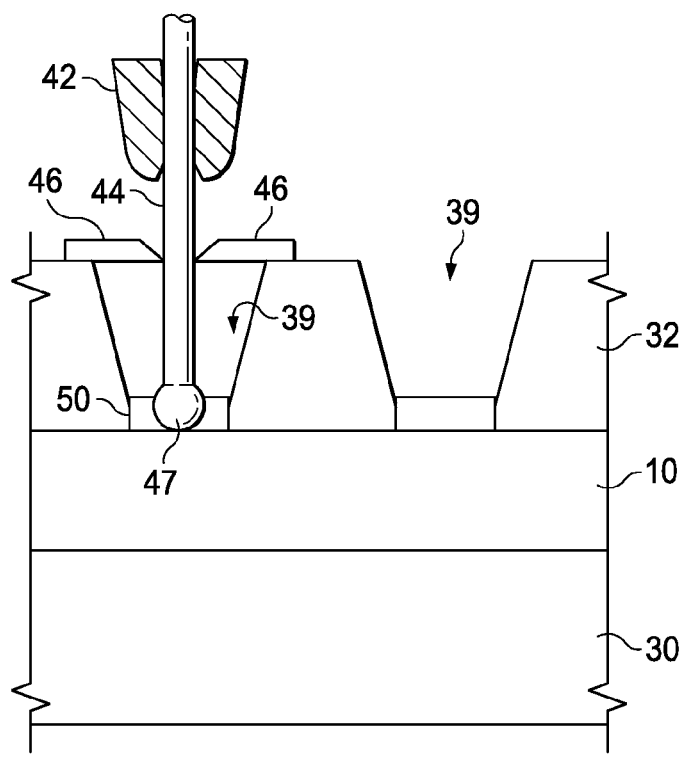

As illustrated in FIG. 4D, the capillary 42 may move up the wire 44 while blades 46 may cut the wire 44 to form wire sticks 52. In an embodiment, the wire sticks 52 may be cut to a length between about 50 um and about 150 um.

FIGS. 5A and 5B illustrate cross-sectional views of the bottom plate 30, the first substrate 10, and the top plate 32 according to embodiments. The pad holes 39 in the top plate 32 may hold the wire sticks 52 such that they may be bonded to be substantially orthogonal to the top surface of the first substrate 10. In FIG. 5A, the sidewalls of the pad holes 39 in the top plate 32 are substantially linear and form a tapered profile from a top surface of the top plate 32 to a bottom surface of the top plate 32. In this embodiment, the sidewalls of the pad holes 39 are neither parallel nor perpendicular to the top surface of the first substrate 10. The bottom of the sidewalls of the pad holes 39 are adjacent the adhesive 50 on the bond pads 22. In FIG. 5B, the sidewalls of the pad holes 39 comprise a top section and a bottom section with the top section being tapered and the bottom section being substantially perpendicular to a top surface of the substrate. The pad holes 39 have a width 53 at the top surface of the top plate 32 and a width 54 at the bottom surface of the top plate 32. These widths may be based on the diameter of the wire 44 and also on the size of the capillary 42 (see FIG. 4C). For example, in an embodiment where the wire 44 has a 1 mil diameter, the pad holes 39 may have a width 53 of about 0.12 mm at the top surface of the top plate 32 and may have a width 54 of about 0.11 mm at the bottom surface of the top plate 32. The wire sticks 52 may be placed manually, automatically, singly, or as a group. Although two embodiments for the pad holes 39 of the top plate 32 have been described, other embodiments contemplate any structure to support the wire sticks 52 prior to affixing them to the bond pads 22 is within the scope of this disclosure.

After the wire sticks 52 are inserted into the pad holes 39 and cut, wire sticks 52 are then bonded to the first substrate 10. The procedure for bonding the wire sticks 52 to the first substrate 10 depends on the type of adhesive 50 used. In embodiments in which a solvent-based or curing adhesive is used, the bonding procedure may comprise activating the adhesive 50, or letting the adhesive 50 cure. In embodiments with a solder-based adhesive, the bonding method may comprise reflowing and cooling the solder material to secure the wire stick 52 to the bond pad 22. The bonding process may affix the wire sticks 52 such that they may be orthogonal to the top surface of the first substrate 10.

After the wire sticks 52 are bonded to the first substrate 10, the top plate 32 may be removed as illustrated in FIG. 6. After the top plate 32 is removed, the first substrate 10 may undergo further processing such as, for example, attaching a semiconductor die.

After the top plate 32 has been removed, one or more dies 70 may be provided and attached to the first substrate 10 to form one or more bottom packages 92 as illustrated in FIG. 7. In this embodiment, the first substrate 10 comprises two bottom packages 92 and TSVs 72 to couple the connector elements 74 to the dies 70 and the wire sticks 52.

The bottom package 92 may comprise one or more dies 70 disposed on the top and/or bottom surface of the bottom package 92. The dies 70 may comprise an integrated circuit or chip and may be mounted to a top surface and/or bottom surface of the first substrate 10 by way of connector elements 78 or 74. In the illustrated embodiment, the dies 70 may be mounted to the first substrate 10 using contact bumps that are in contact with mounting pads on the first substrate 10, which in turn are electrically connected to other dies 102*a* or 102*b* (see FIG. 9) or the connector elements 74. In another embodiment the dies 70 may be mounted to the first substrate 10 using a technique such as surface mounting, to connect the pins of the die 70 to an array of die mounting pads on the first substrate 10.

Connecter elements 78 are shown disposed in an underfill 76, which may provide stress relief and protection for the connector elements 78. Underfill materials provide some stress relief and may include thermally conductive filler materials, to assist in handling mechanical stress from thermal expansion. Underfill 76 may comprise resins, epoxies, polymers, no flow underfill (NUF), capillary underfill, the like, or a combination thereof and may be injected between the dies 70 and the first substrate 10. The two bottom packages 92 may then be singulated into two separate bottom packages 92 as illustrated in FIG. 8.

FIG. 9 illustrates a semiconductor device 1 according to an embodiment. The semiconductor device 1 may include a bottom package 92, a top package 90 mounted to the bottom package 92 with solder joints 96, and the bottom package 92 mounted to a third substrate 94. In an embodiment, the semiconductor device may have a total thickness between about 0.98 mm and about 1.35 mm.

The third substrate 94 may have bond areas 95 on a top surface of the third substrate 94. In an embodiment, the third substrate 94 may be a silicon substrate, a silicon or glass interposer, a PCB, an organic laminate substrate, or the like. The third substrate 94 may include electronic components and elements formed thereon in some embodiments, or alternatively, the third substrate 94 may be free of electronic components and elements. The bottom package 92 may be coupled to the third substrate by the connector elements 74 and bond areas 95.

The top package 90 may comprise one or more stacked dies, such as the dies 102a and 102b, coupled to a second substrate 100. In the illustrated embodiment, the dies 102a and 102b are coupled to the second substrate 100 by wire bonds 104, although other connections may be used, such as contact bumps.

The dies 102a and 102b may be encapsulated in a molding compound 106 on a top surface of the second substrate 100. The molding compound 106 may comprise a polymer, a molding underfill, the like, or a combination thereof. The molding compound 102 may be formed by injecting the molding compound 106 to surround the dies 102a and 102b and the wire bonds 104. In other embodiments, the top package 90 and the bottom package 92 may be encapsulated in a molding compound on a top surface of the third substrate 94.

The top package 90 may be coupled to the bottom package by a plurality of contact areas 98 on the bottom surface of the second substrate 100, the solder joints 96, the wire sticks 52, and the bond pads 22 on the top surface of the first substrate 10.

The wire sticks 52 may provide separation, support, and electrical connectivity between the top package 90 and the bottom package 92. In an embodiment, the wire sticks 52 may have a length large enough to separate the top package 90 and the bottom package 92 far enough to provide adequate space for the die 70. In this embodiment, the top package 90 and the bottom package 92 may be separated by a height 108 of about 150 um, which corresponds to a wire stick 52 height of about 150 um. Greater separation of the top package 90 and the bottom package 92 may be achieved by taller wire sticks 52, which may be necessary in embodiments with a thicker die 70, multiple stacked dies 70, or where dies 70 are mounted on both a bottom surface of the second substrate 100 and the top surface of the first substrate 10. In these embodiments, the top package 90 and the bottom package 92 may be separated by a height 108 of between about 50 um and about 350 um. As one of ordinary skill in the art will appreciate, a predetermined spacing between the top package 90 and the bottom package 92 may be achieved by using a corresponding wire stick 52 height.

The solder joints 96 may be formed by forming solder balls on the contact areas 98 on the bottom surface of the second substrate 100. The bottom package 92 may then be lowered until the plurality of wire sticks 52 are coupled to the plurality of solder balls on the top package 90. The plurality of solder balls may then be reflowed so that the plurality of wire sticks 52 may be inserted in the plurality of solder balls so that a solder joint 96 is formed over each of the wire sticks 52 (see FIG. 9). The solder joints 96 may have a substantially barrel shape in the cross-sectional view. Each of the wire sticks 52 is disposed between the top package 90 and the bottom package 92 and each are embedded in a solder joint 96. In an embodiment, the wire sticks 52 may extend partially to the contact area 98 of the second substrate 100. In another embodiment, the wire sticks 52 may extend fully to the contact area 98 of the second substrate 100.

Embodiments may achieve advantages. The wire sticks 52 may allow for control of the solder joint 96 size and height, enabling a greater range of height of the solder joint 96 than that of a solder ball joint. Also, the wire sticks 52 can be applied to substrates with an OSP layer which may be lower cost than other comparable substrates. Further, the overall height of the package may be reduced due to the low profile of the solder joint 96.

An embodiment is a package-on-package (PoP) device comprising a first package on a first substrate and a second package over the first package. A plurality of wire sticks disposed between the first package and the second package and the plurality of wire sticks couple the first package to the second package. Each of the plurality of wire sticks comprise a conductive wire of a first height affixed to a bond pad on the first substrate and each of the plurality of wire sticks is embedded in a solder joint.

Another embodiment is a PoP device comprising a bottom package comprising a semiconductor die on a first substrate and a plurality of wire sticks disposed on a top surface of the first substrate, wherein each of the wire sticks are bonded to a bond pad on the first substrate. A top package comprising a plurality of vertically stacked dies on a second substrate and a plurality of contacts on a bottom surface of the second substrate, wherein each of the plurality of wire sticks is disposed in one of a plurality of solder joints. Each of the plurality of solder joints is coupled to one or more of the plurality of contacts.

Yet another embodiment is a method of forming a PoP device comprising forming a plurality of bond pads on a first substrate, forming a plurality of wire sticks, and bonding the plurality of wire sticks to the first substrate. Each of the plurality of wire sticks is bonded to one of the bond pads on the first substrate. The method further comprises mounting a first die to the first substrate, mounting a second die to a second substrate, forming a plurality of solder balls on the second substrate, and coupling each of the plurality of wire sticks to one of the plurality of solder balls.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package-on-package (PoP) device comprising:
a first package comprising a first substrate;
a second package over the first package;
a plurality of wire sticks disposed between the first package and the second package, wherein the plurality of wire sticks couple the first package to the second package, and wherein at least one of the plurality of wire sticks comprises a conductive wire of a first height with a first end affixed to a bond pad on the first substrate, the first end comprising a ball shape over the bond pad on the first substrate, and wherein at least one of the plurality of wire sticks is embedded in a solder joint, the solder joint comprising:
an adhesive paste over the bond pad, the first end of the wire stick being disposed in the adhesive paste; and
a solder ball surrounding the wire stick, the solder ball contacting the adhesive paste.

2. The PoP device of claim 1, wherein the conductive wire of the at least one of the plurality of wire sticks is substantially orthogonal to a top surface of the first substrate.

3. The PoP device of claim 1, wherein the first height is between about 50 um and about 150 um.

4. The PoP device of claim 1, wherein the first package comprises a first die coupled to the first substrate, and wherein the second package comprises a plurality of vertically stacked dies coupled to a second substrate.

5. The PoP device of claim 4, wherein each of the solder joints comprises:
the bond pad on the first substrate;
the adhesive paste on the bond pad;
the conductive wire of the wire stick affixed to the bond pad, and wherein the conductive wire of the wire stick is substantially orthogonal to a top surface of the first substrate;
and
a contact on the second substrate, wherein the solder ball is coupled to the contact.

6. The PoP device of claim 5, wherein the conductive wire of the wire stick extends fully to the contact on the second substrate.

7. The PoP device of claim 4 further comprising:
a third substrate; and
a plurality of solder balls disposed between the third substrate and the first substrate, wherein the plurality of solder balls couple the third substrate to the first substrate.

8. The PoP device of claim 1, wherein the plurality of wire sticks comprises a material selected from a group consisting essentially of copper, aluminum, gold, platinum, palladium, or a combination thereof.

9. The PoP device of claim 1, wherein the solder joint comprises:
an organic solderability preservative (OSP) layer on the bond pad; and
the adhesive paste on the OSP layer.

10. A method of forming a PoP device comprising:
forming a plurality of bond pads on a first substrate;
forming a plurality of wire sticks comprising depositing a conductive adhesive on the plurality of bond pads;
bonding the plurality of wire sticks to the first substrate, wherein each of the plurality of wire sticks is bonded to one of the bond pads on the first substrate;
mounting a first die to the first substrate;
mounting a second die to a second substrate;
forming a plurality of solder balls on the second substrate; and
coupling each of the plurality of wire sticks to one of the plurality of solder balls, wherein at least two of the plurality of solder balls is contacting the conductive adhesive.

11. The method of claim 10, wherein the forming the plurality of wire sticks further comprises:
placing the first substrate on a bottom plate;
placing a top plate over the first substrate, wherein the top plate comprises a plurality of holes through the top plate, wherein each of the plurality of holes aligns with one of the plurality of bond pads on the first substrate;
inserting a conductive wire in each of the plurality of holes; and
cutting the conductive wire to a first length, wherein a first end of the cut conductive wire is disposed in the conductive adhesive, and wherein the cut conductive wire is supported by sidewalls of one of the plurality of holes.

12. The method of claim 11, wherein each of the plurality of holes in the top plate taper from the top to the bottom.

13. The method of claim 11, wherein the bonding the plurality of wire sticks to the first substrate further comprises:
heating the first substrate to melt the conductive adhesive, wherein the wire sticks become affixed to the first substrate;
removing the top plate from the first substrate; and
removing the first substrate from the bottom plate.

14. The method of claim 10 further comprising:
forming a plurality of solder balls on the first substrate; and
coupling the first substrate to a third substrate, wherein the plurality of the solder balls are disposed between the first substrate and the third substrate.

15. The method of claim 10, wherein the mounting the first die to the first substrate comprises coupling a plurality of solder bumps on a bottom surface of the first die to a plurality of bond pads on the first substrate.

16. A method of forming a wire stick bond comprising:
forming a plurality of bond pads on a substrate;
depositing a conductive paste on the plurality of bond pads;
placing the substrate on a bottom plate;
placing a top plate over the substrate, wherein the top plate comprises a plurality of holes through the top plate, wherein at least two of the plurality of holes tapers from a top surface of the top plate to a bottom surface of the top plate;
aligning the substrate and the top plate, wherein each of the plurality of holes is over one of the plurality of bond pads;
inserting a first end of a conductive wire through one of the plurality of holes, wherein the first end is disposed in the conductive paste; and
cutting a second end of the conductive wire, wherein the wire has a first height.

17. The method of claim 16 further comprising melting the conductive paste, wherein the melting the conductive paste affixes the conductive wire to one of the plurality of bond pads.

18. The method of claim 16, wherein the inserting the first end of the conductive wire further comprises:
positioning a wire bonder over one of the plurality of holes in the top plate; and dispensing the conductive wire from a capillary in the wire bonder until the first end of the conductive wire is disposed in the conductive paste.

19. The method of claim 16, wherein the aligning the substrate and the top plate further comprises:
inserting a plurality of alignment pins on the bottom plate into a plurality of alignment holes on the substrate; and
inserting the plurality of alignment pins on the bottom plate into a plurality of alignment holes on the top plate.

* * * * *